US006782354B1

(12) United States Patent
Ikegami

(10) Patent No.: US 6,782,354 B1
(45) Date of Patent: Aug. 24, 2004

(54) METHOD FOR PRODUCING SIMULATION MODELS AND SIMULATION SYSTEM USING SIMULATION MODELS

(75) Inventor: Hiroyuki Ikegami, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 645 days.

(21) Appl. No.: 09/686,305

(22) Filed: Oct. 11, 2000

(30) Foreign Application Priority Data

Oct. 12, 1999 (JP) .......................................... 11-290276

(51) Int. Cl.[7] .............................................. G06F 7/60
(52) U.S. Cl. .............................. 703/2; 707/17; 707/18; 707/19; 716/6; 716/7
(58) Field of Search ............................... 703/2, 17, 15, 703/19; 716/18, 6, 7

(56) References Cited

U.S. PATENT DOCUMENTS

| | | | |
|---|---|---|---|
| 5,572,437 A | | 11/1996 | Rostoker et al. |
| 5,598,344 A | * | 1/1997 | Dangelo et al. ............... 716/18 |
| 5,634,003 A | | 5/1997 | Saitoh et al. |
| 5,701,439 A | * | 12/1997 | James et al. ................... 703/17 |
| 5,801,958 A | | 9/1998 | Dangelo et al. |
| 5,870,308 A | | 2/1999 | Dangelo et al. |
| 5,910,898 A | | 6/1999 | Johannsen |
| 6,044,211 A | | 3/2000 | Jain |
| 6,161,211 A | * | 12/2000 | Southgate ....................... 716/1 |
| 6,470,482 B1 | * | 10/2002 | Rostoker et al. ................ 716/6 |

FOREIGN PATENT DOCUMENTS

| | | |
|---|---|---|
| JP | 3-134774 | 6/1991 |
| JP | 4-309178 | 10/1992 |
| JP | 5-61934 | 3/1993 |
| JP | 5-108748 | 4/1993 |
| JP | 5-225277 | 9/1993 |
| JP | 5-258002 | 10/1993 |
| JP | 7-110826 | 4/1995 |
| JP | 8-287134 | 11/1996 |
| JP | 10-261002 | 9/1998 |
| JP | 11-057040 | 3/1999 |

OTHER PUBLICATIONS

"Dynamic multi–level simulation of digital hardware designs", Simulation, SCS, Jun. 1987, vol. 48, No. 6, pp. 247–252.

"The hierarchy level logical simulation machine MAN–YO", bit, parallel computer architecture, Kyoritsu shuppan, Mar. 1989, vol. 21, No. 4, pp. 476–685.

T. Akamura et al., "Parallel Logic Simulator Wizdom"; Japanese Information Processing Society, No. 57, Conference held in 1998.

U.S. patent application Ser. No. 09/517,604, Ikegami, filed on Mar. 2, 2000.

(List continued on next page.)

Primary Examiner—Albert W. Paladini
(74) Attorney, Agent, or Firm—Katten Muchin Zavis Rosenman

(57) ABSTRACT

A simulation system includes a display, a model producing section and a first simulator. The model producing section produces a clock level simulation model and a first table from an algorithm description model and model interface data indicative of input and output of variables related to the algorithm description model. The clock level simulation model is used for simulating operations of resources in units of groups of allowable status transitions of the variables under constraint condition of the resources. The first table indicating correspondence relationship between the variables and the resources in units of status positions. The first simulator carries out the simulation of the algorithm description model to output variable values in each of the status positions.

32 Claims, 11 Drawing Sheets

OTHER PUBLICATIONS

"Digital System Simulation: Methodologies and Examples", K. Olukotun, DAC 98, IBSN 1–58113–049–x/98/06, Jun. 1998.

"Power Minimization in IC Design: Principles and Applications" M. Pedram, ACM 1084–4309/96/0100–0003, Jan. 1996.

"Fast Hierarchical Multi–Level Fault Simulation of Sequential Circuits with Switch–Level Accuracy" W. Meyer, ACM/IEEE: Desig Automation Conference, 0–89791–577, 1993.

"Dynamic Multi–Level Simulation of Digital Hardware Designs" Simulation, SCS, Jun. 1987, vol. 48, No. 6, pp. 247–252.

"The Hierarchy Level Logical Simulation Machine Man–Yo", Bit Parallel Computer Architecture, Kyoritsu Shuppan, Mar. 1989 vol. 21, No. 4, p. 476–485.

"Parallel Logic Simulator Wizdom" (The 57$^{th}$ National Conference of Information Processing Society of Japan 1998).

* cited by examiner

```
1: INT DATAPATH (INT a, b, c, d)
2: {
3:      X=(a+b);
4:      X=(c+d)+X;
5:      RETURN(X);
6: }
```

Fig. 9

|  | REG1 | REG2 | REG3 | REG4 | REG5 |
|---|---|---|---|---|---|
| STATUS 0 | — | — | — | — | — |
| STATUS 1 | a | b | — | — | — |
| STATUS 2 | — | — | X | c | d |
| STATUS 3 | — | t2 | X | — | — |
| STATUS 4 | — | — | — | — | X |

Fig. 10

|  | CORRESPONDING SOURCE LINE |
|---|---|
| STATUS 0 | - |
| STATUS 1 | FILE1.c:3 |
| STATUS 2 | FILE2.c:4 |
| STATUS 3 | FILE3.c:4 |
| STATUS 4 | FILE4.c:4 |

METHOD FOR PRODUCING SIMULATION MODELS AND SIMULATION SYSTEM USING SIMULATION MODELS

BACKGROUND OF THE INVENTION

1. Field of the Invention

The present invention generally relates to a method of producing simulation models and a simulator using the simulation models.

2. Description of the Related Art

Large-scaled circuits are automatically designed by use of automatic designing apparatuses. Designing flows of the automatic designing apparatuses contain a process of rewriting the highest level description into the lowest level description such as a RT (register transfer) level description. In the highest level description, a desirable operation flow is described by use of a general purpose programming language such as the C language, or an exclusively used operation level description language. In the lowest level description, the desirable operation flow is described by use of a hardware description using hardware resources such as a register and an adder. As illustrated in FIGS. 1A and 1B, in an operation level simulation model 101 having a higher abstract degree, a simulation is carried out based on only an operation simulation model 101 from the beginning to the end. The simulation on the basis of an RT level simulation model 102 cannot be performed during the simulation on the basis of the operation level simulation model 101. Similarly, in the RT level simulation model 102 having a lower abstract degree, the simulation on the basis of only the RT level simulation model 102 is carried out from the beginning to the end. The simulation on the basis of the operation level simulation model 101 cannot be carried out during the simulation on the basis of the RT level simulation model 102. In this way, the simulations of a plurality of simulation models having different abstract degrees from each other cannot be carried out simultaneously.

In this way, the operation level simulation model 101 and the RT level simulation model 102 are handled independently from each other, so that it is impossible to switch from one simulation to another simulation during the simulation. In general, the highest simulation model is used when the simulation speed is an important aspect, whereas the RT level simulation model is used when accuracy is an important aspect. When further higher accuracy is required, another lowest simulation model is used.

However, when a simulation of a function verification is carried out, there is a case that the simulation state from a certain time "t1" to another time "t2" should be analyzed in detail. In such a case, when the higher accuracy simulator is used for analysis of the simulation state from the time "t0" to the time "t2", lengthy time would be required for the simulation.

As the technique capable of solving such a problem, a mixed simulation technique is known from Japanese Laid Open Patent Application (JP-A-Heisei 5-61934) and the publication entitled "PARALLEL LOGIC SIMULATOR WIZDOM" (Japanese Information Processing Society, No. 57, Conference held in 1998). In this mixed simulation technique, the simulation is switched between a plurality of simulation models having different abstract degrees from each other such as an instruction level simulation model and an RT level simulation model. Since both of the instruction level simulation model and the RT level simulation model use common structures such as a register, the switching between the instruction level simulation model and the RT level simulation mode is possible.

Also, Japanese Laid Open Patent Application (JP-A-Heisei 7-110826) discloses the technique capable of switching between the simulation in a gate level model and the simulation in an electronic circuit level model. This simulation switching operation is accomplished based on the fact that the terminal of the gate circuit corresponds to the terminal of the electronic circuit.

On the other hand, Japanese Laid Open Patent Application (JP-A-Heisei 10-261002) discloses a simulation switching operation. In this reference, a circuit operation of the circuit is described in a fine definition model and a coarse definition model using a circuit description.

In this way, the above conventional simulation switching operations are known between the higher level model and the lower level model, and between the models having the same levels using the common description, although the fine degrees of the models are different form each other.

However, a highest program language description level as an operation description level" and an RT level as a lower description level are not same in the structure for holding the simulation states. For this reason, no data can be transferred between the highest program language description level model and the RT level model. Therefore, conventionally, the simulations cannot be switched between these models. Thus, a technique is required to allow the simulation model between which are not described in a one-to-one correspondence relationship to be switched.

The technique for such requirement is disclosed in copending U.S. patent application Ser. No. 09/517,604 filed on Mar. 2, 2000 and entitled "LOGIC SIMULATION METHOD IN WHICH SIMULATION IS SWITCHABLE BETWEEN MODELS AND SYSTEM FOR THE SAME" by the inventor of the present invention. The disclosure of the above application is incorporated herein by the reference.

The inventor found the necessity of a model having an intermediate level between the algorithm description level and an RT level.

SUMMARY OF THE INVENTION

Therefore, an object of the present invention is to provide a method of produce simulation models described by a language of an algorithm level having higher abstract degree, a language of an RT level having a lower abstract degree, and a language of an intermediate level between the algorithm level and the RT level.

Another object of the present invention is to provide a simulator which can provide a simulation result in more higher accuracy than the algorithm level simulation and at a higher speed than the RT level simulation.

In an aspect of the present invention, a simulation model producing method is attained by decomposing a total function of an algorithm description model into functions; by scheduling the functions based on clocks in units of groups of allowable status transitions of variables related to the algorithm description model; by allocating resources to each of the scheduled functions under constraint condition of the resources; and by assembling the functions to produce a clock level simulation model.

Here, the simulation model producing method may further include producing a hardware level simulation model based on the resources. In this case, a simulation time of the clock level simulation model is shorter than that of the hardware level simulation model and longer than that of the algorithm description model.

Also, the allocation may be attained by producing a FSM/datapath model based on the functions; and by producing a table indicating correspondence relationship between variables to the algorithm description model and the resources in units of the clocks. In this case, the assembling may include producing the hardware level simulation model based on the table, the FSM/datapath model, and a model interface data.

In order to achieve another aspect of the present invention, a simulation system includes a display, a model producing section and a first simulator. The model producing section produces a clock level simulation model and a first table from an algorithm description model and model interface data indicative of input and output of variables related to the algorithm description model. The clock level simulation model is used for simulating operations of resources in units of groups of allowable status transitions of the variables under constraint condition of the resources. The first table indicating correspondence relationship between the variables and the resources in units of status positions. The first simulator carries out the simulation of the algorithm description model to output variable values in each of the status positions.

Here, the simulation system may further include a control unit which refers to the first table based on the each status position and the variable values to control the display to display resource values for the resources in units of the status positions. Also, the model producing section may further produce a second table from the algorithm description model and the model interface data. The second table indicates correspondence relationship between each of source lines of the algorithm model and a status position.

Also, the simulation system may further include a control unit which refers to the second table based on the each status position to control the display to display the source line for each of the status positions.

Also, the model producing section may further produce a hardware level simulation model from the algorithm description model and the model interface data, the hardware level simulation model being used for simulating the operations of the resources in units of the resources. At this time, the simulation system may further includes: a second simulator carrying out the simulation of the algorithm description model; and a third simulator carrying out the simulation of the hardware level simulation model. In this case, a simulation time of the clock level simulation model is shorter than that of the hardware level simulation model and longer than that of the algorithm description model.

Also, the control unit may carry out simulation while switching between the first to third simulators in response to a switching request.

Also, the variable includes variables expressed in the algorithm description model and temporary variables used in the simulation.

Also, the model producing section decomposes a total function of the algorithm description model into functions, schedules the functions based on clocks in units of groups of allowable status transitions of variables related to the algorithm description model, allocating resources to each of the scheduled functions under constraint condition of the resources and assembles the functions to produce the clock level simulation model.

Also, the model producing section produces an FSM/datapath model based on the algorithm description model and the model interface data, and produces the clock level simulation model from the FSM/datapath model, the model interface data, and the first table.

In still another aspect, a simulation method is attained by producing a clock level simulation model and a first table from an algorithm description model and model interface data indicative of input and output of variables related to the algorithm description model, the clock level simulation model being used for simulating operations of resources in units of groups of allowable status transitions of the variables under constraint condition of the resources, and the first table indicating correspondence relationship between the variables and the resources in units of status positions; and by carrying out the simulation of the algorithm description model to output variable values in each of the status positions.

Here, the simulation method may further include: referring to the first table based on the each status position and the variable values to control a display unit to display resource values for the resources in units of the status positions.

Also, the simulation method may further include: producing a second table from the algorithm description model and the model interface data, the second table indicating correspondence relationship between each of source lines of the algorithm model and a status position; and referring to the second table based on the each status position to control a display unit to display the source line for each of the status positions.

Also, the simulation method may further include: producing a hardware level simulation model from the algorithm description model and the model interface data, the hardware level simulation model being used for simulating the operations of the resources in units of the resources; carrying out the simulation of the algorithm description model; and carrying out the simulation of the hardware level simulation model. In this case, the simulation method may further include: carrying out the simulation while switching between the first to third simulators in response to a switching request.

Also, a simulation time of the clock level simulation model is shorter than that of the hardware level simulation model and longer than that of the algorithm description model.

Also, the variable includes variables expressed in the algorithm description model and temporary variables used in the simulation.

Also, the production may be attained by decomposing a total function of the algorithm description model into functions; by scheduling the functions based on clocks in units of groups of allowable status transitions of variables related to the algorithm description model; by allocating resources to each of the scheduled functions under constraint condition of the resources; and by assembling the functions to produce the clock level simulation model.

Also, the production may be attained by producing a FSM/datapath model based on the algorithm description model and the model interface data; and by producing the clock level simulation model from the FSM/datapath model, the model interface data, and the first table.

In order to achieve yet still another aspect of the present invention, a recording medium is provided in which a program for a simulation method is stored. The simulation method is attained by producing a clock level simulation model and a first table from an algorithm description model and model interface data indicative of input and output of variables related to the algorithm description model, the clock level simulation model being used for simulating operations of resources in units of groups of allowable status transitions of the variables under constraint condition of the resources, and the first table indicating correspondence relationship between the variables and the resources in units of status positions; and by carrying out the simulation of the algorithm description model to output variable values in each of the status positions.

BRIEF DESCRIPTION OF THE DRAWINGS

FIG. 9 is a diagram showing FSM/DataPath model description and a variable/register/status position correspondence table;

FIG. 10 is a diagram showing a source line/status position correspondence table;

DESCRIPTION OF THE PREFERRED EMBODIMENTS

Hereinafter, a simulation system of the present invention will be described below in detail with reference to the attached drawings.

Figure 1:
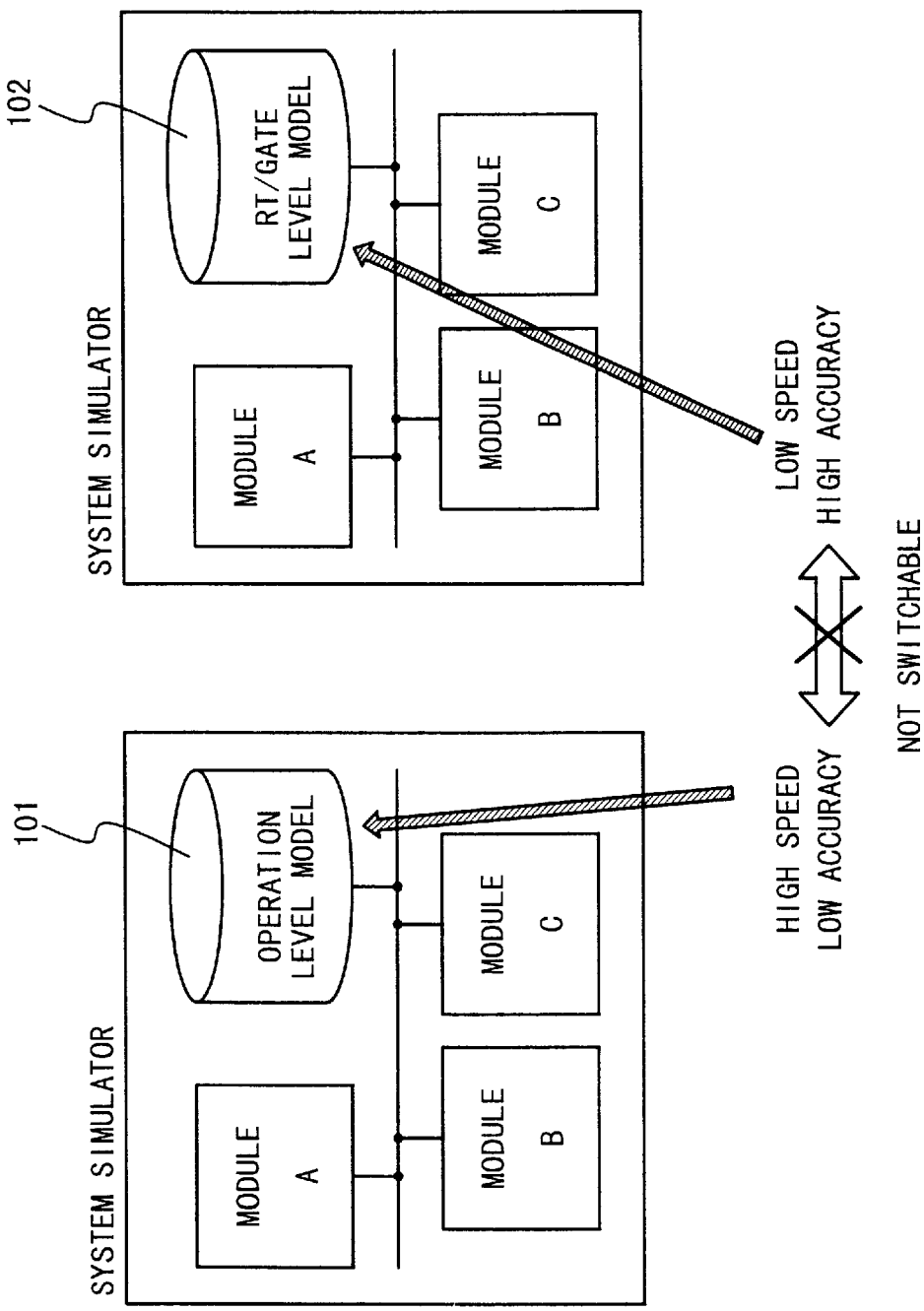
FIGS. 1A and 1B are diagram showing an operation level simulation model having a higher abstract degree and an RT simulation model having a lower abstract degree.
Figure 2:
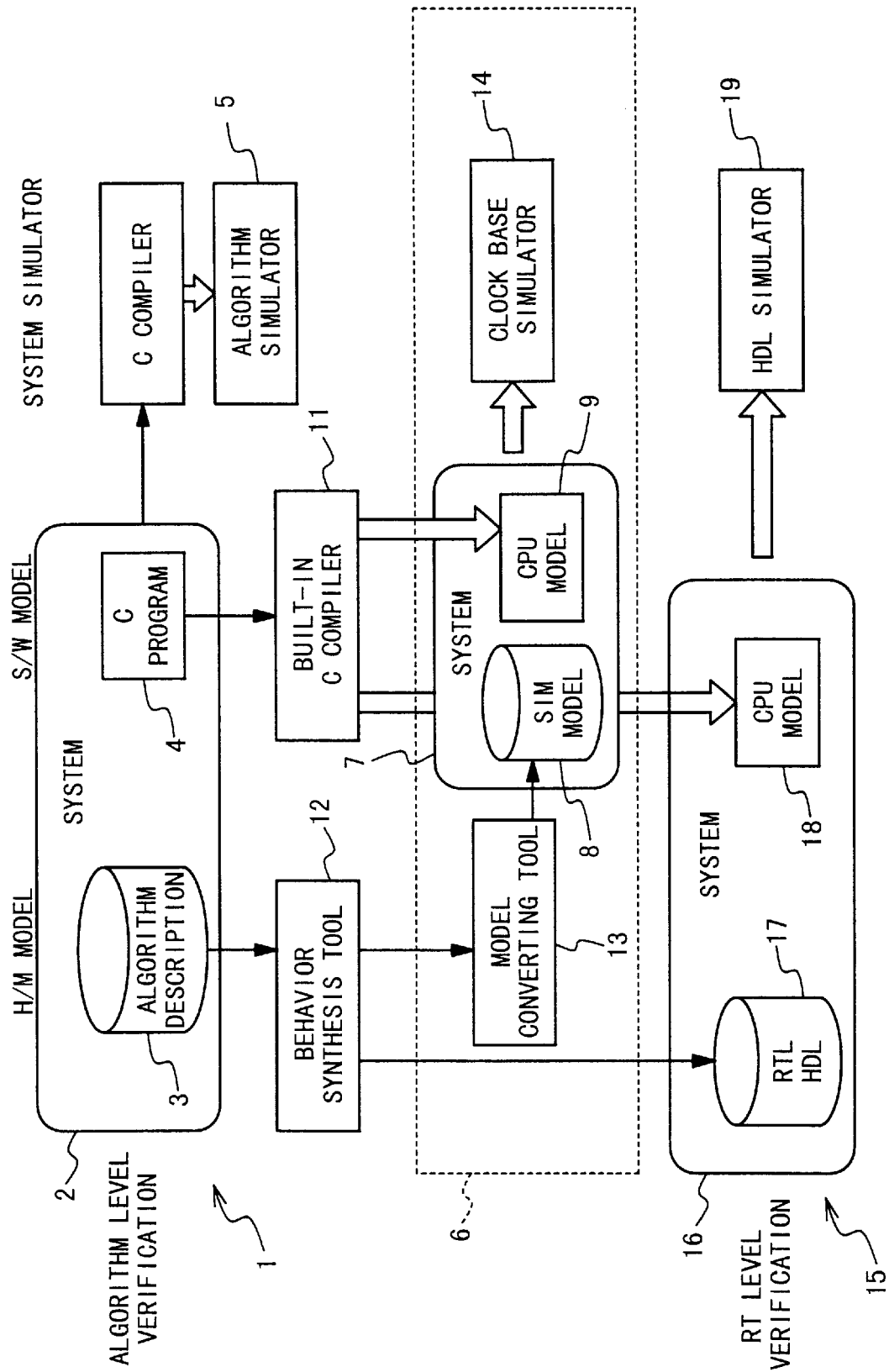
FIG. 2 is a block diagram showing the structure of a simulation system according to an embodiment of the present invention.

FIG. 2 is a block diagram showing the structure of the simulation system according to an embodiment of the present invention. Referring to FIG. 2, the simulation system is composed of an algorithm level verifying section 1, a clock level verifying section 6 and an RT level verifying section 15. The clock level verifying section 6 is provided between the algorithm level verifying section 1 and the RT level verifying section 15.

The algorithm level verifying section 1 is composed of an algorithm system 2. The algorithm system 2 provides an algorithm description model 3 having a highest abstract degree and describing a hardware (H/W) model, and a C language program 4 describing a software (S/W) model in a C language. A semiconductor device to be simulated in the present invention has an LSI having a CPU therein. The processing by the CPU is described in the C language program and the processing by the hardware is described in the algorithm description model 3. The algorithm system 2 is converted into an algorithm level simulation model by a C language compiler, and an algorithm level simulation is carried out based on the algorithm level simulation model by an algorithm level simulator 5.

A clock level verifying section 6 is composed of a clock level system 7. The clock level system 7 is composed of a clock level simulation (SIM) model 8 described by a clock level description, and a clock level CPU model 9. The clock level CPU model 9 of the clock level system 7 is automatically produced from the C language program 4 by a C language compiler 11. The algorithm description 3 is description-converted into the clock level model 8 by a model converting tool 13 having a tool of the behavior synthesis tool 12. In the description conversion, a register as a tool of the behavior synthesis tool 12 is used as a terminology (either a word or a primary variable). The clock base simulator 14 carries out a clock level simulation based on the clock level simulation model 8 and the clock level CPU model 9.

An RT level verifying section 15 is composed of an RT level system 16. The RT level system 16 is composed of a register transfer level—hardware level (RTL-HDL) model 17, and an RT level CPU model 18. The RTL-HDL model 17 is automatically produced from the algorithm description 3 by the behavior synthesis tool 12. The RT level CPU model 18 is produced from the C language program 4 by the C language compiler 11. An HDL simulator 19 carries out the RT level simulation based on the RT level simulation model 17 and the RT level CPU model 18.

As described above, in a simulation method of the present invention, the production of the clock level simulation model 8 under constraint of resources can be attained by decomposing a total function of the algorithm description model 3 into functions, by scheduling the functions based on clocks in units of groups of allowable status transitions of variables related to the algorithm description model 3, by allocating resources to each of the scheduled functions under constraint condition of the resources, and by assembling the functions to produce a clock level simulation model 8. The total function is expressed by a language having a register as a variable. The language having the register as the variable is a lower programming description language by the inventor of the present invention. In the clock level simulation model 8, one of the plurality of registers as resources description is shared and operated between clocks.

Figure 3:
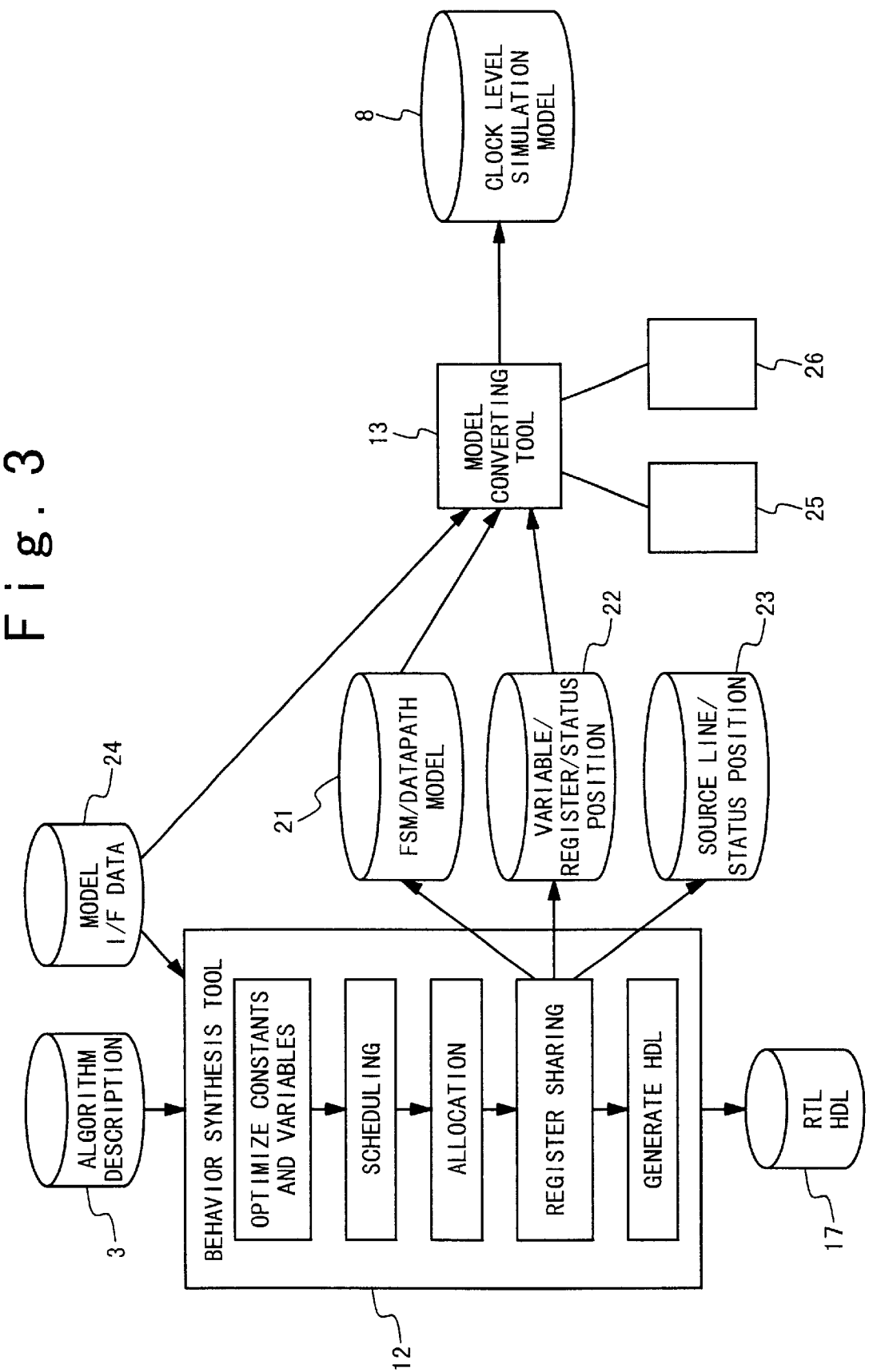
FIG. 3 is a diagram showing the structure of a model producing tool for a clock level simulation model and a flow for automatically producing the clock level simulation model.

FIG. 3 represents the structures of a model producing tool for the clock level model 8 and a flow for automatically producing the clock level model 8. The behavior synthesis tool 12 contains a function for optimizing constants and variables, a scheduling function, an allocating function, a register sharing function, and a hardware level model producing function. The register sharing function has a function to produce the following three:

(1) an FSM (finite state machine)/DataPath model 21 controlling state transitions of a plurality of register resources used under constraints of the resources by a data path control;

(2) a variable/register/status position correspondence table 22 representing correspondence of a variable, a register, and a status position; and (3) a source line/status position correspondence table 23 representing correspondence of a source line described in the algorithm description model 3 and a status position thereof.

A model I/F data 24 is supplied to the behavior synthesis tool 12 and the model converting tool 13. The model converting tool 13 converts in description the algorithm description model 3 into the clock level model 8 based on the model I/F data 24, the FSM/DataPath model 21, and the variable/register/status position correspondence table 22. Thus, the clock level model 8 can be automatically produced from the algorithm description model 3. For the automatic production of the clock level model 8, the model conversion tool 13, library data are supplied from a debug function library 25 and a model I/F library 26 to this model converting tool 13.

Figure 4:
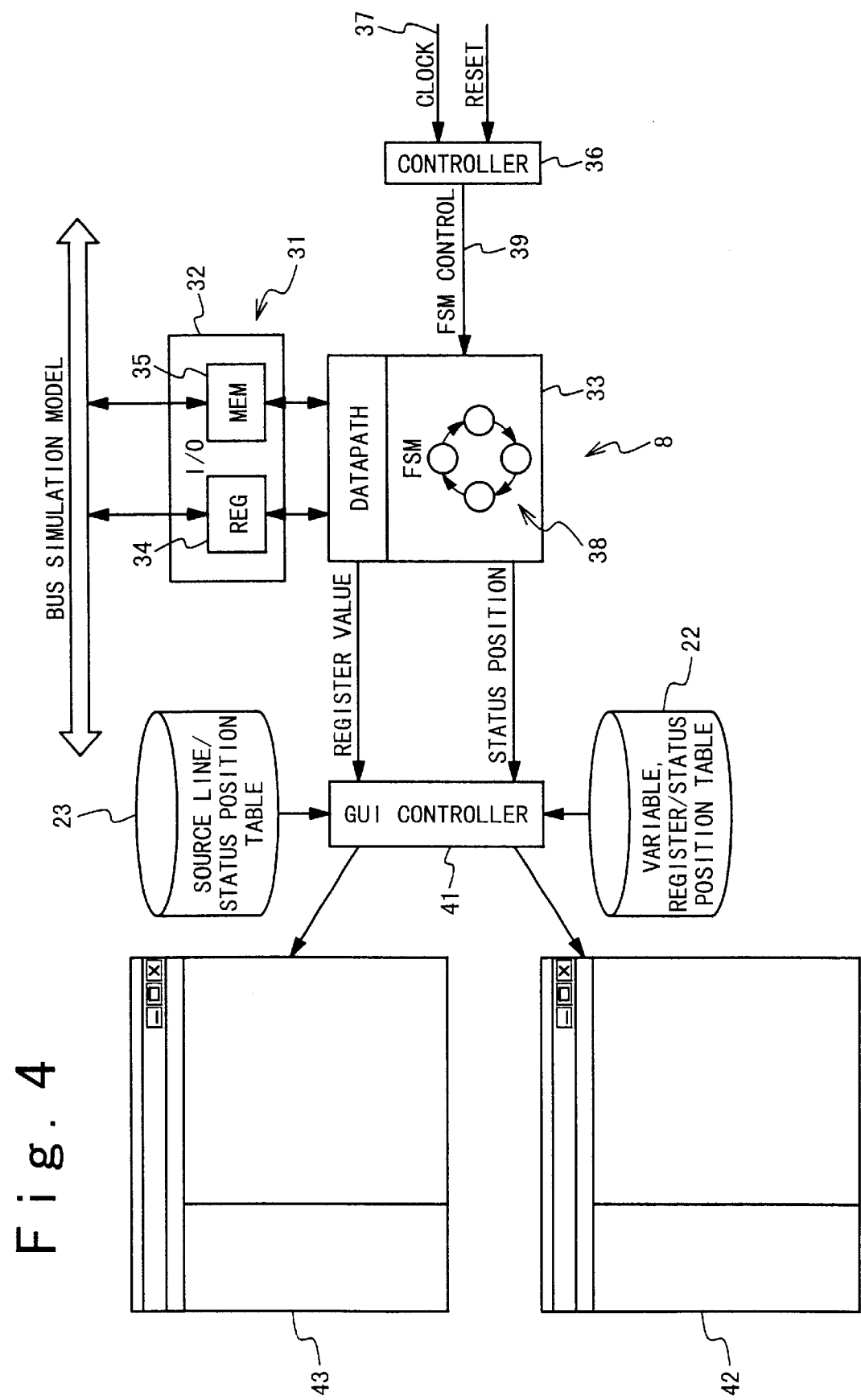
FIG. 4 is a diagram showing a description structure of the clock level simulation model.

FIG. 4 is a diagram showing a description structure of the clock level simulation model 8. The clock level simulation model 8 is composed of a Bus simulation model 31. The Bus simulation model 31 is composed of a module I/O section 32 and a data path describing section 33. A plurality of I/O registers 34 and a plurality of I/O memories 35 are described in the module I/O section 32. The model I/O section 32 has an I/O register structure and an I/O memory structure. The I/O register structure is produced from the model I/F data 24, and read/written via an input/output terminal of the simulation model by built-in software. The clock level simulation model 8 transfers a signal to another module via a module I/O section. As will be described later, the data path describing section 33 contains data paths for describing relationship between a plurality of I/O registers and a plurality of operators, and also a control structure for controlling an operation in calculation thereof in units of clocks.

A simulation controller 36 is connected to the data path describing section 33. The simulation controller 36 executes a circulate stepwise control (FSM control) of a calculation operation transition 38 in which the clock of the data path describing section 33 is advanced one by one in response to clock input 37 from a simulator main body. An FSM control signal 39 is supplied from the simulation controller 36 to the data path describing section 33.

The data path describing section 33 is connected to a GUI (graphic user interface) controller 41. The data path describing section 33 outputs a register value "R" and a status position value "S" corresponding to a calculation transition position. The register value "R" and the status position value "S" are supplied into the GUI controller 41. When a reset signal is inputted into the simulation controller 36, the register value "R" and the sate position value "S" of the data path describing section 33 are both initialized.

The GUI controller 41 can acquire a correspondence relationship between a register of a current transition status position and a variable described by an algorithm level description from the variable/register/status position correspondence table 22 shown in FIG. 3. The GUI controller 41 furthermore can acquire a source line corresponding to the current transition status position in the algorithm level description from the source line/status position correspondence table 23.

The GUI controller 41 is connected to an algorithm level described variable value display window 42 and an algorithm level described source line display window 43. In the variable value display window 42, a correspondence relationship acquired from the variable/register/status position correspondence table 22 based on the register value "R" of the register as the variable value is displayed on a transition status position thereof. The correspondence relationship between an algorithm level described variable value and a register temporarily disappear, because the plurality of registers are shared between partially different transition states. For this reason, the algorithm level described variable value is saved in the GUI controller 41. Thus, the latest variable values of the latest transition state are always displayed on the variable value display window 42.

On the other hand, in the algorithm level described source line display window 43, a source line position value "R" corresponding to the current state transition position in the algorithm level description is displayed in highlight, while a correspondence relationship is given based upon the present transmission status position from the source line/status position correspondence table 23. Furthermore, in the GUI controller 41, since the algorithm described variables, registers, the total number of times of changes in units of clocks, the total number of times of state transitions to the respective states, a transition source and a transition destination are measured during the simulation, covering ratios of the variables, the registers, and the status transition are measured. Such a covering ratio may be used as an index for indicating how wide the verification could be carried out by a test pattern.

Algorithm Verification

A software model and a hardware model contained in a system are both described in a programming language. The hardware model represents an algorithm of the hardware, and the software model expresses built-in software. These programming language descriptions are compiled by the C language compiler, and the algorithm level simulation model is produced. As indicated in the below-mentioned items (1) and (2), items which can be verified by an algorithm level simulation model having no data related to the hardware are only purely logical operations. The simulation using the algorithm level simulation model is very high speed.

(1) Verification for logical operations of the respective modules, and (2) Verification for logical operations of the system.

Clock Level Verification

The algorithm description model 3 of the hardware model is processed by the behavior synthesis tool 12 and the model converting tool 13, so that the clock level model is produced. The software model 4 is read as the built-in software into a simulation model of the CPU, to realize operation timings equivalent to those of the actual CPU. The hardware model as well as the software model has timing precision equivalent to the timing precision of the actual LSI system in the clock level. Therefore, the below-described items can be estimated and also verified by executing the simulation of the clock level simulation model 8.

(1) Verification of operation timings in the clock level of the respective modules, (2) Rough verification of interfaces of the respective modules (I/O registers, I/O memories, constructions/names/bit widths etc. of I/O terminals), (3) Estimation of operation clock frequencies of the respective modules/buses, (4) Estimation of cache access (cache hit rate, access rate, write back time, etc.), (5) Estimation of access (occupation rate of bus, address, data, master, slave, read/write, and command per bus transaction, word number, occupation time, etc.), (6) Verification for algorithm of Bus and Arbiter, (7) Estimation of traffic of memory/IF, (8) Estimation of throughput of data processing operation (throughput per module, throughput per bus, and throughput per entire system), (9) Estimation of buffer size and stack size,

(10) Estimation of image quality and sound quality,

(11) Verification of matching characteristics of module interconnection I/F such as address map, terminal, and bit width,

(12) Estimation executed in the case that a floating point is converted into a fixed point,

(13) Development/Debugging operations of installed software, and

(14) Rough estimation of power consumption.

RT Level Verification

As the hardware model, an RTL-HDL model 17 produced by the behavior synthesis tool is used. The RTL-HDL model 17 has timing containing an asynchronous operation higher precision than the clock level. The software model 18 is read as the built-in software into the simulation model of the CPU similar to the clock level simulation. These the RTL-HDL model 17 and the CPU model are simulated on the HDL simulator 19, and the following items may be verified and estimated:

(1) Precise verification for interfaces of the respective modules (control timing operation, address timing operation, and timing operation of data terminal), (2) Precise timing verification for the respective modules, (3) Precise estimation of power consumption, and (4) Forming of patterns used to tester.

EXAMPLES

Figure 11:
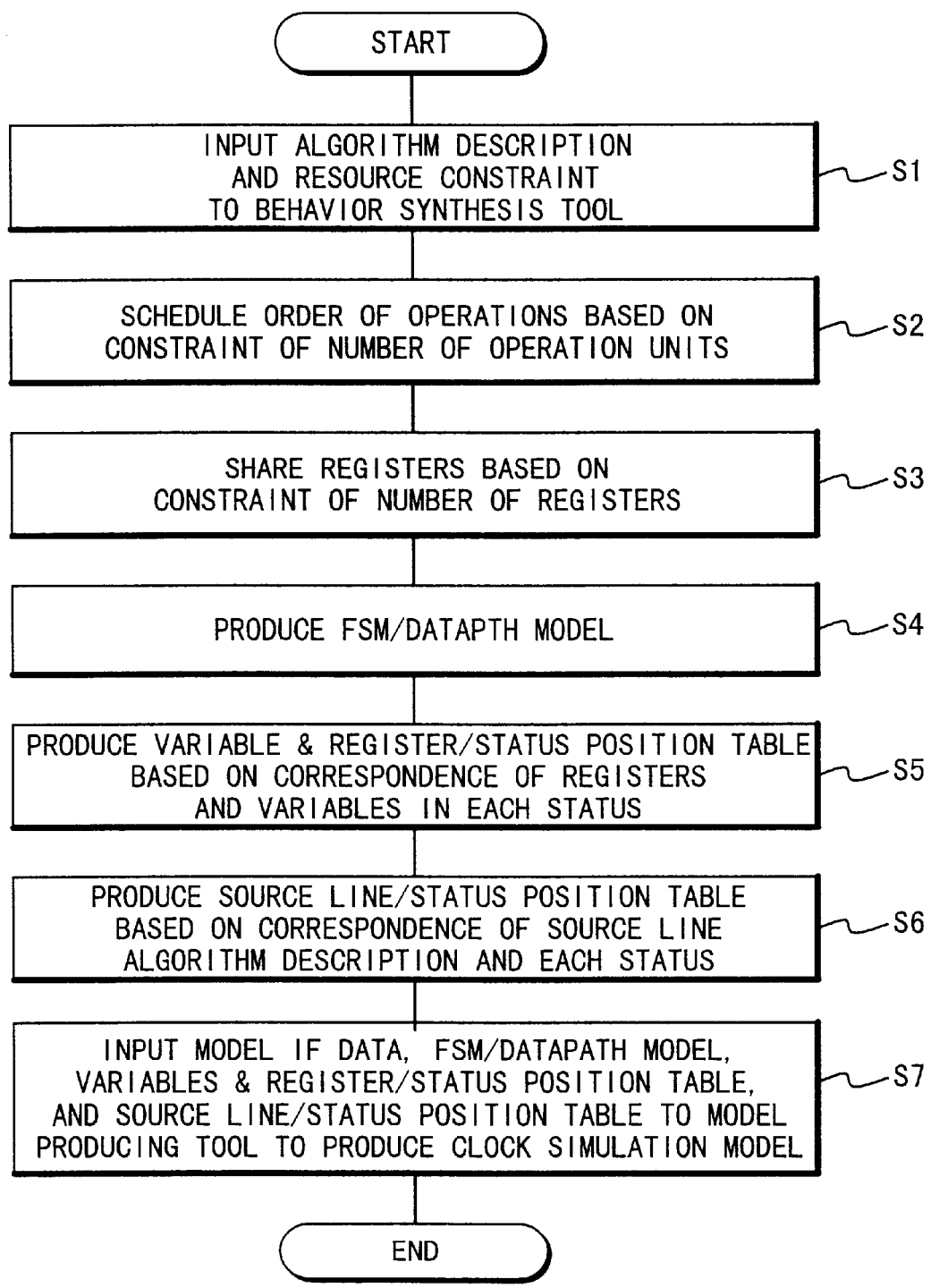
FIG. 11 is a flow chart for describing a method of producing simulation models according to the embodiment of the present invention.

FIG. 11 is a flow chart for describing a method of producing simulation models according to the embodiment mode of the present invention. Referring now to this flow chart of FIG. 11, a method of producing a clock level simulation model 8 will be described. The FSM/DataPath model description and the variable/register/status position correspondence table shown in FIG. 9, and a source line/status position correspondence table shown in FIG. 10 are produced from the algorithm description model 3 indicated in FIG. 5, and then the clock level simulation model 8 is produced.

Figures 5, 6:
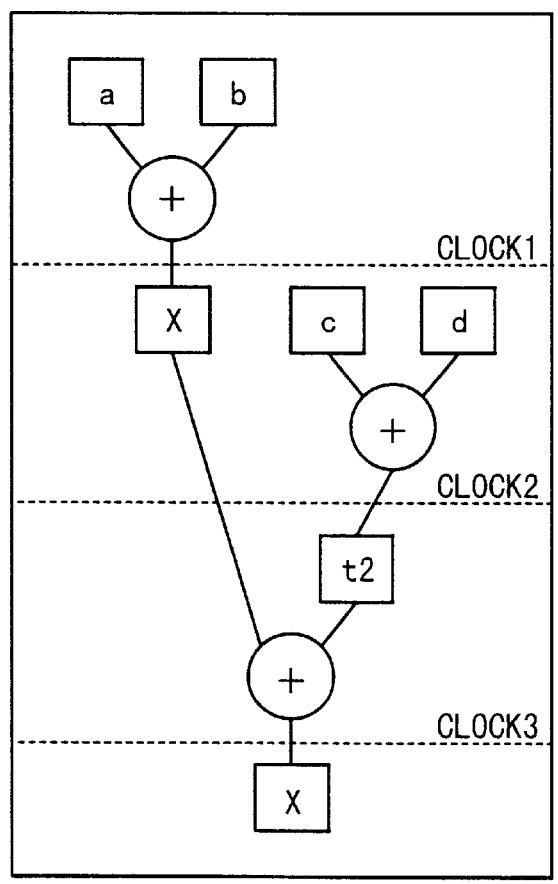
FIG. 5 is a diagram showing an example of algorithm description.
FIG. 6 is a diagram showing a time-divided calculating processes.

FIG. 5 exemplifies an algorithm description model 3 (see FIG. 2). The behavior synthesis tool 12 inputs the algorithm description model 3 and a constraint condition of resources of a circuit. In this case, the constraint condition is assumed as follows:

register: 5 sets, and adder: 1 set.

In the algorithm description model 3 shown in FIG. 5, 5 sets of variables "a", "b", "c", "d", and "X" are contained, and also 3 sets of adders are necessitated. The number of adders which can be simultaneously used is limited to be 1 from the resource constraint condition. Therefore, the calculating process is time-divided, and the time-divided calculating processes are as shown in FIG. 6. In the calculating process of Clock 1 in FIG. 6, the variable "a" is added to the variable "b", and thereafter, the addition result is substituted for the variable "X". In the calculating process of Clock 2 in FIG. 6, the variable "c" is added to the variable "d" by use of the same adder as that used in Clock 1, and a variable "t2" is newly produced to be substituted for the variable "X" in order to temporarily hold the addition result. Furthermore, in the calculating process of Clock 3 in FIG. 6, the variable "X" is added to the variable "t2" by use of the same adder as that used in Clock 1 and Clock 2, and then the addition result is substituted for the variable "X." The calculating process will be referred to as scheduling function (step S2).

Figure 7:
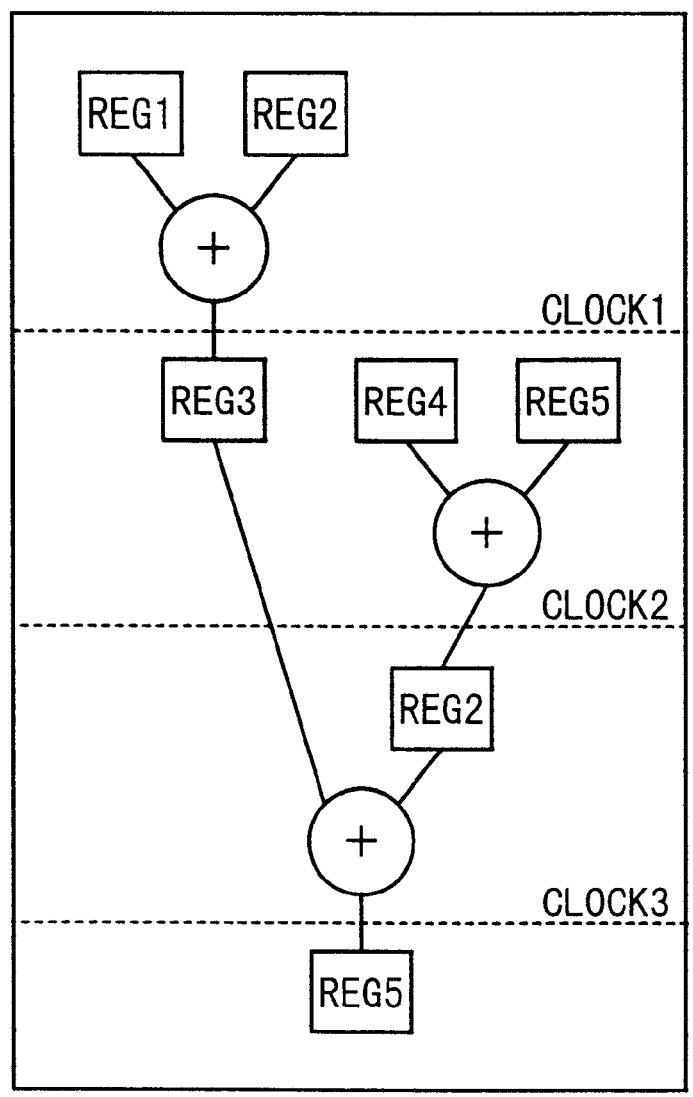
FIG. 7 is a diagram showing an FSM/DataPath model.

In order that the calculating process indicated by the algorithm description model 3 shown in FIG. 5 is realized by use of a single adder under the constraint condition by executing the scheduling function, the following fact can be understood. That is, three clocks are required, and six variables of "a", "b", "c", "d", "X", and "t2" are required. With respect to the resource constraint condition related to the register, only 5 sets of registers are available at the same time. As a result, these five registers are similarly required to be shared. When the registers are shared, "Reg 1" to "Reg 5" are allowed based on the register constraint condition and are first allocated to the variables "a" and "b" of Clock 1 and the variables "X", "c", and "d" of Clock 2. As to the variable "t2" of Clock 3, any one of the registers "Reg 1" to "Reg 5" needs to be properly utilized. If the variable "X" of Clock 2 is obtained, then the contents of the registers "Reg 1" and "Reg 2" which have been allocated to the variables "a" and "b" in Clock 1 need not be saved. As a result, the registers "Reg 1" and "Reg 2" may be properly used after Clock 2. In this embodiment, it is supposed that the register "Reg 2" is allocated to the variable "t2" of Clock 3. Similarly, the register "Reg 5" which may be properly used after Clock 3 is allocated to the final calculation result variable "X". The registers are shared under the register constraint condition given in the above-described manner (step S3). The model obtained when the calculating processes defined at the above-explained step S1, step S2, and step S3 is applied to the algorithm description model 3 of FIG. 5 is described in the programming language, and as this result, the below-indicated FSM/DataPath model is determined, as shown in FIG. 7.

FIG. 9 indicates the variable/register/status position correspondence table 22. The variable/register/status position correspondence table 22 is produced from a correspondence table between the variable and the clock shown in FIG. 6, and another correspondence table between the registers and the clocks shown in FIG. 6. Clock 1 to Clock 3 shown in FIG. 6 correspond to states 1 to 3 of FIG. 9. In the state 1 of FIG. 9, namely in Clock 1 of FIG. 6 and FIG. 7, a register "Reg 1" has a value of a variable "a", and a register "Reg 2" has a value of a variable "b." In the state 2, a register "Reg 3" has a value of a variable "X", a register "Reg 4" has a value of a variable "c", and a register "Reg 5" has a value of a variable "d." In the state 3, a register "Reg 2" has a value of a variable "t2", and a register "Reg 3" has a value of a variable "X." In the state 4, a register "Reg 5" has the value of the variable X. Furthermore, as an initial condition, another state "0" is produced in which no variable is allocated to all of the registers. As previously described, the variable/register/status position correspondence table 22 represents a correspondence relationship between the variables and the registers in the respective states (namely, Clocks) (step S5).

FIG. 10 shows a table content of the above-explained source line/status position correspondence table 23. An addition between the variable "a" and the variable "b" in Clock 1 corresponds to a third line in the algorithm description model 3 of FIG. 5. Also, an addition between the variable "c" and the variable "d" in Clock 2 corresponds to a fourth line in the algorithm description model 3 of FIG. 5. Also, an addition between the variable "X" and the variable "t2" in Clock 3 corresponds also to the fourth line in the algorithm description model 3 of FIG. 5. Also, a state under which a final calculation result "X" is obtained corresponds to a fifth line in the algorithm description model 3 of FIG. 5. Similar to FIG. 9, the states 1 to 3 of FIG. 10 correspond to Clock 1 to Clock 3 of FIG. 6 and FIG. 7. As previously described, a correspondence relationship between the line positions and the status positions in the algorithm description model 3 obtained in the above manner corresponds to the source line/status position correspondence table 23. The model I/F data 24, the FSM/DataPath model 21, the variable/register/status position correspondence table 22, and the source line/status position correspondence table 23 are supplied to the model converting tool 13 so that a clock level simulation model 8 is produced (step S7). In this case, the model I/F data 24 has data used to define an interface which may interface an external circuit module and a circuit module represented by the algorithm description model 3. The contents of this model I/F data 24 contain a command register and a status register, which can be accessed from a bus, a structure of a data memory, and furthermore, a bit width and a synchronization system of a data transfer path between its module and another module.

Figure 8:
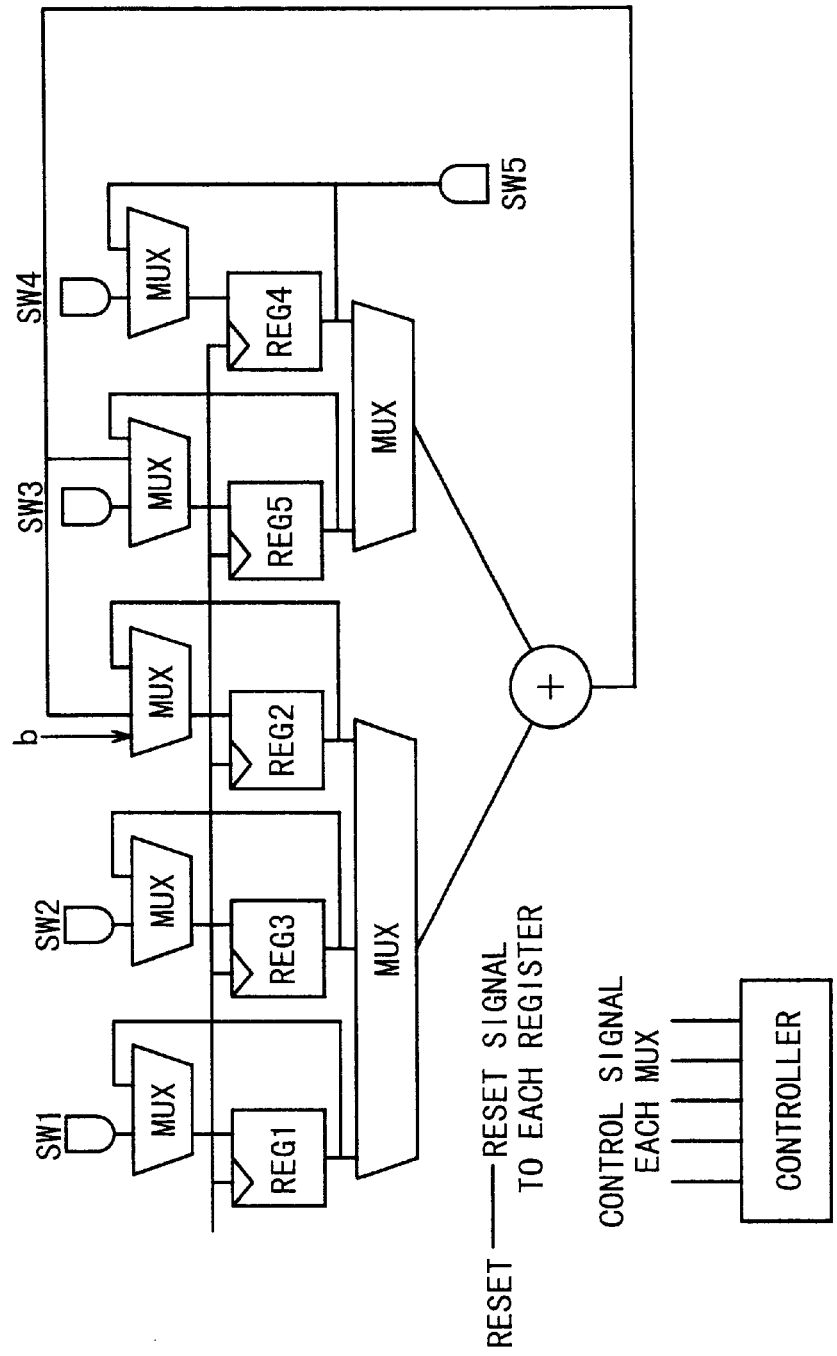
FIG. 8 is a diagram showing an RTL-HDL model automatically produced by a behavior synthesis tool.

As indicated in FIG. 8, the RTL-HDL model 17 of the RT level system 16 is automatically produced by way of the behavior synthesis tool 12. The hardware structure which has been automatically produced by the tool 12 has five sets of registers 1 to 5, seven sets of multiplexers 1 to 7, and five sets of switches SW1 to SW5. To hold a value of a register, the hardware model having an abstract degree lower than that of the clock level model would require a feedback function and multiplexers. The feedback function feeds back the output of the register to the data input thereof. The hardware model further requires a clock control for continuously supplying a clock signal to all of the registers, and also a control signal 44 for controlling each multiplexer. In addition, the multiplexers are required to select one from among the plurality of registers which an input is commonly used to the calculator. As will be described later, the hardware model requires various sorts of hardware components and control signal lines used to control these hardware components.

The clock level model 8 is described by the clock level description equal to a description language of a logic level functioning as a language operated in the section of a clock as follows:

```
int DataPath (int a, b, c, d, rest)
{
    static it FSM position;
    static int Reg1, Reg2, Reg3, Reg4, Reg5,
Reg5;
    if (rest = = 1) {
        FSM position = 0;
        return (0);
    }
    switch (FSM position) {
    case 0:
        Reg1=a; Reg2=b; Reg3=Reg1 + Reg2;
        FSM position=1
        break;
    case 1:
        Reg4=c; Reg5=d; Reg2=Reg4 + Reg5;
        FSM position=2
        break;
    case 2:
        Reg5=Reg3+ Reg2;
        FSM position=3
        break;
    case 3:
        X=Reg5;
        FSM position=0
        break;
```

Case 1 is made coincident with a step of a clock 1, Case 2 is made coincident with a step of a clock 2, and Case 3 is made coincident with a step of a clock 2. As explained above, the clock level description is produced in which the registers 1 to 5 are subdivided in the section of the clock so as to be used. This clock level description owns a more detailed expression, as compared with the expression made by the algorithm description model 3 shown in FIG. 5. However, this clock level description is made simpler than an RT level description (will be explained later). Although different from contents of relevant algorithms, the inventor of the present invention could recognize such a fact that simply speaking, the simulation time of an operation of an LSI using the algorithm description model 3 is approximately equal to 1/500 of the simulation time of the same operation using the clock level simulation model, and also the operation time of the same operation using the clock level simulation model is approximately equal to 1/500 of the simulation time of the same operation using the RT level model.

For the sake of reference, a VHDL description corresponding to FIG. 8 is described as follows:

RT hardware description 1:
entity FF is
port(
   Reset: in std_ulogic;
   Data: in std_ulogic_vector (31 downto 0);
   Clock: in std_ulogic;
   Q: in std_ulogic_vector (31 downto 0);
);
end FF;

RT hardware description 2:
architectur A of FF is
begin
process(Reset, clock)
begin
   if(Reset='1') then
     Q<='0';
   elsif(Clock='event) then
   if(Clock='1') then
     Q<='XXXXXXXXXXXXXXXXXXXXXXX
       XXXXXXX';
   endif;
   endif;
end process;
end A;

RT hardware description 3:
entity MUX is
port(
   A: in std_ulogic_vector (31 downto 0);
   B: in std_ulogic_vector (31 downto 0);
   Sel: in std_ulogic;
   Out: in std_ulogic_vector (31 downto 0);
);
end FF;

architecture A of MUX is
begin
process(A, B, Sel)
begin
   if(Sel='0') then
     Out<=A;
   elsif(Sel='1') then
     Out<=B;
   else
     O u t < =
      'XXXXXXXXXXXXXXXXXXXXXXXX
      XXXX';

```
    endif;
end process;
end A;

RT hardware description 4:
entity MUX3 is
port(
   A: in std_ulogic_vector (31 downto 0);
   B: in std_ulogic_vector (31 downto 0);
   C: in std_ulogic_vector (31 downto 0);
   Sel: in std_ulogic_vector (1 downto 0);
   Out: out std_ulogic_vector (31 downto 0);
);
end MUX3;

RT hardware description 5:
architecture A of MUX3 is
begin
process(A, B, C, Sel)
begin
   if(Sel='00') then
      Out<=A;
   elsif(Sel='01') then
      Out<=B;
   elsif(Sel='10') then
      Out<=C;
   else
      O u t < =
         'XXXXXXXXXXXXXXXXXXXXXXXXXXXX
         XXXX';
   endif;
end process;
end A;

RT hardware description 6:
entity ADDER is
port(
   A: in std_ulogic_vector (31 downto 0);
   B: in std_ulogic_vector (31 downto 0);
   Out: out std_ulogic_vector (31 downto 0);
);
end AddER;

RT hardware description 7:
architecture A of ADDER is
begin
Out<=A;+B;
end A;

entity DATAPATH is
port(
   a: in std_ulogic_vector (31 downto 0);
   b: in std_ulogic_vector (31 downto 0);
   c: in std_ulogic_vector (31 downto 0);
   d: in std_ulogic_vector (31 downto 0);
   Clock: in std_ulogic;
   Reset: in std_ulogic;
   X: out std_ulogic_vector (31 downto 0);
);
end DATAPATH;

RT hardware description 8:
architecture A of DATAPATH is
component FF
port(
   Reset: in std_ulogic;
   Data: in std_ulogic_vector (31 downto 0);
   Clock: in std_ulogic;
   Q: out std_ulogic_vector (31 downto 0);
);
end component;

RT hardware description 9:
component MUX
port(
   A: in std_ulogic_vector (31 downto 0);
   B: in std_ulogic_vector (31 downto 0);
   Sel: in std_ulogic;
   Out: out std_ulogic_vector (31 downto 0);
);
end component;

RT hardware description 10:
component MUX3
port(
   A: in std_ulogic_vector (31 downto 0);
   B: in std_ulogic_vector (31 downto 0);
   C: in std_ulogic_vector (31 downto 0);
   Sel: in std_ulogic_vector (1 downto 0);
   Out: out std_ulogic_vector (31 downto 0);
);
end component;

RT hardware description 11:
component ADDER
port(
   A: in std_ulogic_vector (31 downto 0);
   B: in std_ulogic_vector (31 downto 0);
   Out: out std_ulogic_vector (31 downto 0);
);
end component;

RT hardware description 12:
component CONTROLLER
port(
   Clock: in std_ulogic;
   Sel1: out std_ulogic;
   Sel2: out std_ulogic;
   Sel3: out std_ulogic;
   Sel4: out std_ulogic;
   Sel5: out std_ulogic;
   Sel6: out std_ulogic;
   Sel7: out std_ulogic;
   Sel8: out std_ulogic;
   Sel9: out std_ulogic;
);
end component;

RT hardware description 13:
- -Register outputs
signal a_out:std_ulogic_vector(31 downto 0);
signal b_out:std_ulogic_vector(31 downto 0);
signal c_out:std_ulogic_vector(31 downto 0);
signal d_out:std_ulogic_vector(31 downto 0);
signal t1_out:std_ulogic_vector(31 downto 0);
signal x_out:std_ulogic_vector(31 downto 0);
- -MUX select inputs
signal a_muxsel:std_ulogic;
signal b_muxsel:std_ulogic_vector(1 downto 0);
signal c_muxsel:std_ulogic;
signal d muxsel:std_ulogic;
signal t1_muxsel:std_ulogic;
signal add_in1_muxsel:std_ulogic_vector(1 downto
0);
```

```
signal add_in2_muxsel:std_ulogic_vector(1 downto
0);
    signal x_muxsel:std_ulogic
    - -MUX outputs
    signal a_muxout:std_ulogic_vector(31 downto 0);
    signal b_muxout:std_ulogic_vector(31 downto 0);
    signal c_muxout:std_ulogic_vector(31 downto 0);
    signal d_muxout:std_ulogic_vector(31 downto 0);
    signal t1_muxout:std_ulogic_vector(31 downto 0);
    signal add_in1_muxout:std_ulogic_vector(31 downto
0);
    signal add_in2_muxout:std_ulogic_vector(31 downto
0);
    signal x_muxout:std_ulogic_vector(31 downto 0);
    - -operator in/out
    signal add_in1:std_ulogic_vector(31 downto 0);
    signal add_in2:std_ulogic_vector(31 downto 0);
    signal x_out:std_ulogic_vector(31 downto 0);

RT hardware description 14:
    begin
    X<=x_out;

L_a_reg: FF port map(Rese, a_muxout, Clock, a_out);
    L_b_t2_reg: FF port map(Rese, b_muxout, Clock,
b_out);
    L_c_reg: FF port map(Rese, c_muxout, Clock, c_out);
    L_d_reg: FF port map(Rese, d_muxout, Clock, d_out);
    L_t1_reg: FF port map(Rese, t1_muxout, Clock,
c_out);
    L_x_reg: FF port map(Rese, x_muxout, Clock, x_out);
    L_a_mux: MUX port map(a, a_out, a_muxsel,
a_muxout);
    L_b_mux: MUX3 port map(b, b_out, add_out,
b_muxsel, b_muxout);
    L_c_mux: MUX port map(c, c_out, c_muxsel,
muxout);
    L_d_mux: MUX port map(d, d_out, d_muxsel,
d_muxout);
    L_t1_mux: MUX port map(add_out, t1_out,
t1_muxsel, t1_muxout);
    L_x_mux: MUX port map(x, x_out, x_muxsel,
x_muxout);

L_add_in1_mux: MUX3 port map(a_out, c_out,
t1_out, add_in1_muxsel, add_in1);
    L_add_in2_mux: MUX3 port map(b_out, d_out,
t2_out, add_in2_muxsel, add_in2);

L_adder:_ADDER port map(add_in1, add_in2, add_
out); end A;
```

The above-explained descriptions do not contain the description related to the controller. The first 6 lines of the above-explained RT hardware description 14 correspond to a description portion related to an FF register, the succeeding 6 lines of this RT hardware description 14 correspond to a description portion related to a multiplexer, and the next succeeding 6 lines of this RT hardware description correspond to a description portion related to an addition by an adder. Both amounts of the descriptions at both levels correspond to a time duration required for simulation of both levels.

Figure 12:
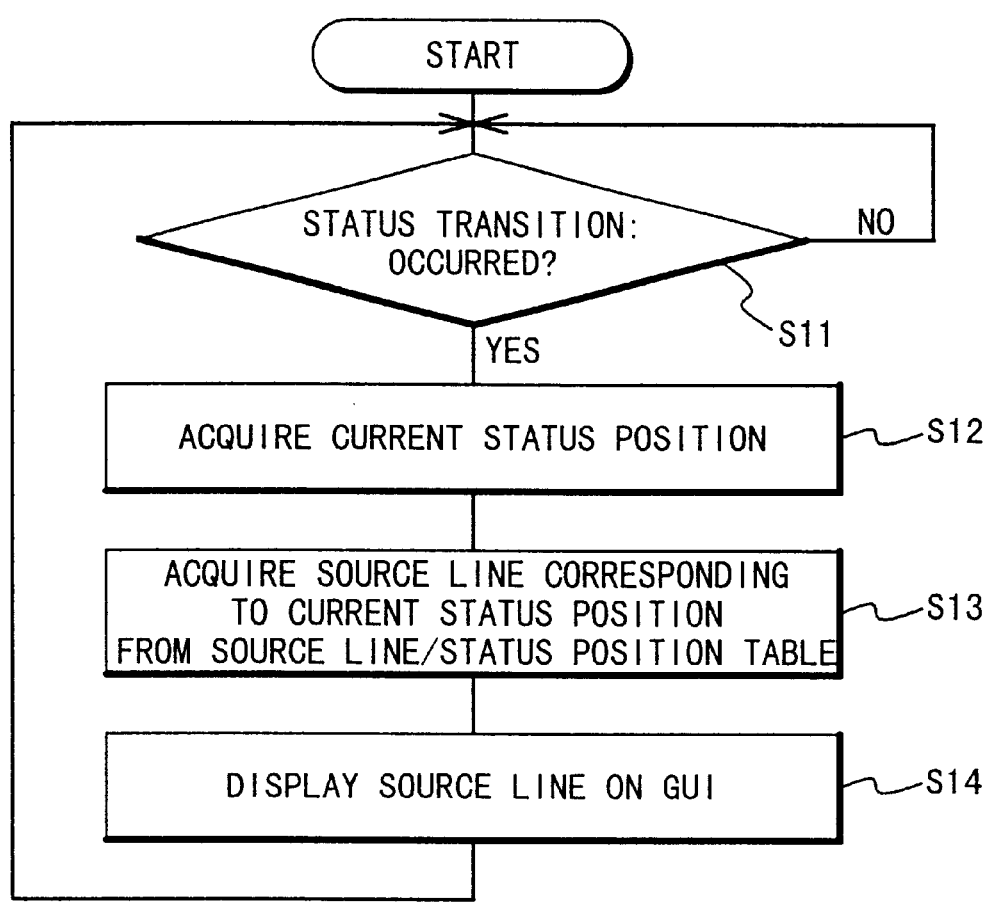
FIG. 12 is a flow chart for describing a method of displaying an algorithm description model source line on an algorithm level described source execution line display window 43.

FIG. 12 is a flow chart for describing a method of displaying an algorithm description model source line on an algorithm level described source execution line display window 43. Every time, a state transition occurs (step S11), the GUI control section 41 interrogates a present status position to an FSM/DataPath section 33 (step S12). For example, when the present status position is equal to a state 2, it can be seen from the source line/status position correspondence table 23 that the corresponding source file is "file 1.c", and the line number is a fourth line (step S13). The source file obtained in this manner is displayed on the GUI and furthermore, the line corresponding to the present status position is displayed in highlight manner. As a result, the user can indicate the present execution position on the algorithm level description (step S14).

Figure 13:
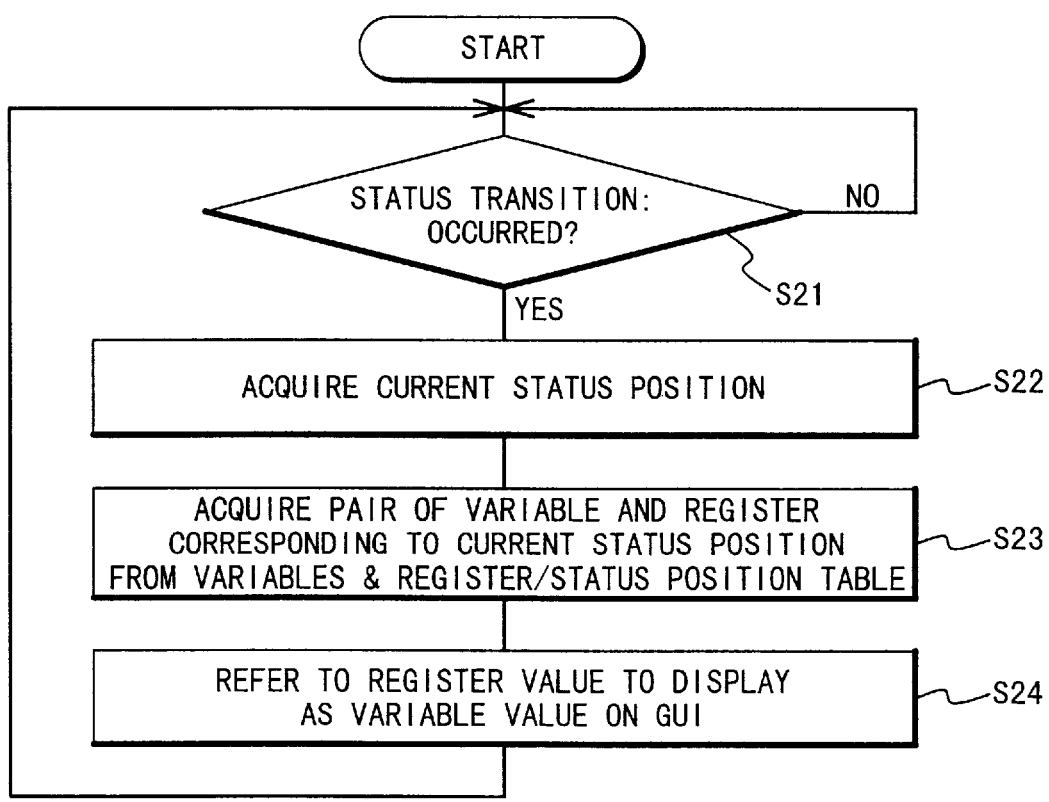
FIG. 13 is a flow chart for describing a method of displaying a variable contained in an algorithm description model on an algorithm level variable display window 42.

FIG. 13 is a flow chart for describing a method of displaying a variable contained in an algorithm description model 3 on an algorithm level variable display window 42. Every time a state transition occurs (step S21), the GUI control section 41 interrogates a present status position to the FSM/DataPath section 33 (step S22). For example, when the present status position is equal to a state 3, it can be seen from the variable/register/status position correspondence table 22 that variables used in the state 3 are "t2" and "X", and the corresponding registers are "Reg 2" and "Reg 3" (step S23). The GUI controller section 41 acquires the register value of Reg 2 and the register value of Reg 3 from the FSM/DataPath section 33 to open these register values. The register values are displayed as the values of the variables "t2" and "X" or the algorithm description model 3 variable display window 42 (step S24). As a result, even when the registers are commonly used, the user may observe a change in the register values within the clock level simulation model 8 as a change in the variable values on the algorithm level description on the GUI.

As to the clock level simulation model 8, the below-mentioned simulations are omitted, as compared with the RTL-HDL model having the structure of FIG. 8:

(1). The RTL-HDL model requires the feedback control and the mutiplexer in order to hold the register values and then to output these register values. The clock level simulation model 8 realized by use of the programming language need not own such a feedback control and a multiplexer so as to hold the variable value unless the substitution occurs.

(2). In the RTL-HDL model, since the clock signal is continuously supplied to all of the registers, the register value is continuously updated by either the new data input value or the value saved by this register. To the contrary, in the clock level simulation model 8, since only such a variable where the data is newly entered is updated, the simulation process operation can be carried out in high speed without unnecessary updating process operation.

(3). In the RTL-HDL model, since the calculator is commonly used, the multiplexer is required which may select one register from a plurality of registers which constitute the input. In the clock level simulation model 8, there is no limitation in the user of such calculators, namely the calculators need not be commonly used. Moreover, the clock level simulation model 8 need not employ such a multiplexer capable of selecting the inputs of the calculators.

(4). Since the multiplexer is no longer required in order to commonly use the calculators in the clock level simulation model 8, such a circuit for producing the control input required in the mutiplexer is no longer required.

(5). In the RTL-HDL model, the asynchronous reset signals are supplied to all of the registers. However, in the clock level simulation model 8, since only the operation in the section of the clock time period is handled, the asynchronous operation need not be carried out.

(6). The RTL-HDL model owns such a structure using the sub-modules, for instance, the registers, the multiplexers, the calculators and so on. The sub-modules have the terminals, and own the signal lines, the control mechanisms, and the like, which are provided inside these sub-modules. In the clock level simulation model 8, the registers are expressed as the variables of the programming language, the multiplexers are expressed as the condition statements, and the calculators are expressed as the operators. As a consequence, the simulation process operation can be largely simplified.

(7). In the RTL-HDL model, various structural components must be strictly expressed in accordance with the actual hardware as follows: The bit positions of the bundle line are arranged in the ascent/descent order thereof; the code is present, or absent; the signal modes such as integer/bit vector modes are discriminated; and the conversions among these items are carried. To the contrary, these discriminations are not strictly carried out in the clock level simulation model 8.

(8). The parallel characteristics of the operation among the respective sub-modules realized in the RTL-HDL model are strictly expressed. To the contrary, since the verification is not carried out based upon a difference in the precise operation timing of the respective sub-module in the clock level simulation model 8, the parallel characteristics of the operation need not be strictly expressed.

(9). In the RTL-HDL model, for example, the operation executed when the reset signal is changed is strictly expressed, while the change timing of the clock signal is strictly expressed. In the clock level simulation model 8, since only the operation in the section of the clock signal is handled, the process operation with respect to the asynchronous operation can be simplified.

As previously described in detail, in accordance with the simulation model and also the method of producing/describing this simulation model of the present invention, since such a language can be discovered, the simulation in the intermediate level can be carried out. This discovered language owns such a level whose abstract degree is lower than the abstract degree of the algorithm level, and further is higher than the abstract degree of the RT level. Based upon the description whose abstract degree is lower than the abstract degree of the algorithm level and also is higher than the abstract degree of the RT level, the simulation can be carried out in such a manner that the precision thereof is higher than the precision of the algorithm description model 3, and also the simulation speed thereof is faster than the simulation speed of the RT level description. Generally speaking, while the simulation language of the hardware components which are more physically and more precisely described is made by the logic language and the hardware components are used as the variables, the programming language can be formed. Also, the intermediate language of the plural-level description known in the field can be formed.

In addition, the simulation system may includes a control unit (not shown) for switching between the simulation using the algorithm description model, the simulation using the clock level simulation model, and the simulation using the RT level simulation model in response to a switching instruction. Thus, a desired simulation can be carried out using a desired simulation model.

What is claimed is:

1. A simulation model producing method comprising:
   a behavior synthesis tool decomposing a total function of an algorithm description model into functions;
   said behavior synthesis tool scheduling said functions based on clocks in units of groups of allowable status transitions of variables related to said algorithm description model;
   said behavior synthesis tool allocating resources to each of said scheduled functions under constraint condition of said resources; and
   a model converting tool assembling said functions to produce a clock level simulation model.

2. The simulation model producing method according to claim 1, further comprising:
   said behavior synthesis tool producing a hardware level simulation model based on said constraint condition of said resources.

3. The simulation model producing method according to claim 2, wherein a simulation time of said clock level simulation model is shorter than that of said hardware level simulation model and longer than that of said algorithm description model.

4. The simulation model producing method according to claim 1, wherein said allocating includes:
   producing a FSM/datapath model based on said functions;
   producing a table indicating correspondence relationship between said variables related to said algorithm description model and said resources in units of said clocks.

5. The simulation model producing method according to claim 4, wherein said assembling includes:
   producing said hardware level simulation model based on said table, said FSM/datapath model, and a model interface data.

6. A simulation system comprising:
   a display;
   a model producing section which produces a clock level simulation model and a first table from an algorithm description model comprising variables and operations performed on said variables, and model interface data indicative of input and output of variables related to said algorithm description model, said clock level simulation model being used for simulating operations of resources in units of groups of allowable status transitions of said variables related to said algorithm description model under constraint condition of said resources, and said first table indicating correspondence relationship between said variables related to said algorithm description model and said resources in units of status; positions, said clock level simulation model being provided by a model converting tool based on said model interface data and said first table; and
   a first simulator which carries out said simulation of said algorithm description model to output variable values in each of said status positions.

7. The simulation system according to claim 6, further comprising:
   a control unit which refers to said first table based on said each status position and said variable values to control said display to display resource values for said resources in units of said status positions.

8. The simulation system according to claim 6, wherein said model producing section further produces a second table from said algorithm description model and said model interface data, said second table indicating correspondence relationship between each of source lines of said algorithm model and a status position, and said simulation system further comprises:

a control unit which refers to said second table based on said each status position to control said display to display said source line for each of said status positions.

9. The simulation system according to claim 8, wherein said model producing section further produces a hardware level simulation model from said algorithm description model and said model interface data, said hardware level simulation model being used for simulating said operations of said resources in units of said resources, and said simulation system further comprises:

a second simulator carrying out said simulation of said algorithm description model; and a third simulator carrying out said simulation of said hardware level simulation model.

10. The simulation system according to claim 9, wherein said control unit carries out simulation while switching between said first to third simulators in response to a switching request.

11. The simulation system according to claim 6, wherein said variables related to said algorithm description model include variables included in said algorithm description model and temporary variables used in said simulation.

12. The simulation system according to claim 9, wherein a simulation time of said clock level simulation model is shorter than that of said hardware level simulation model and longer than that of said algorithm description model.

13. The simulation system according to claim 6, wherein said model producing section decomposes a total function of said algorithm description model into functions, schedules said functions based on clocks in units of groups of allowable status transitions of said variables related to said algorithm description model, allocating resources to each of said scheduled functions under constraint condition of said resources and assembles said functions to produce said clock level simulation model.

14. The simulation system according to claim 6, wherein said model producing section produces a FSM/datapath model based on said algorithm description model and said model interface data, and produces said clock level simulation model from said FSM/datapath model, said model interface data, and said first table.

15. A simulation method comprising:

producing a first table from an algorithm description model comprising variables and operations performed on said variables and model interface data indicative of input and output of variables related to said algorithm description model;

producing a clock level simulation model from said first table and said model interface data, said clock level simulation model being used for simulating operations of resources in units of groups of allowable status transitions of said variables related to said algorithm description model under constraint condition of said resources, and said first table indicating correspondence relationship between said variables related to said algorithm description model and said resources in units of status positions; and carrying out said simulation of said algorithm description model to output variable values in each of said status positions.

16. The simulation method according to claim 15, further comprising:

referring to said first table based on said each status position and said variable values to control a display unit to display resource values for said resources in units of said status positions.

17. The simulation method according to claim 15, further comprising:

producing a second table from said algorithm description model and said model interface data, said second table indicating correspondence relationship between each of source lines of said algorithm model and a status position; and referring to said second table based on said each status position to control a display unit to display said source line for each of said status positions.

18. The simulation method according to claim 15, further comprising:

producing a hardware level simulation model from said algorithm description model and said model interface data, said hardware level simulation model being used for simulating said operations of said resources in units of said resources;

carrying out said simulation of said algorithm description model; and carrying out said simulation of said hardware level simulation model.

19. The simulation method according to claim 18, further comprising:

carrying out said simulation while switching between said first to third simulators in response to a switching request.

20. The simulation system according to claim 18, wherein a simulation time of said clock level simulation model is shorter than that of said hardware level simulation model and longer than that of said algorithm description model.

21. The simulation method according to claim 15, wherein said variables related to said algorithm model include variables included in said algorithm description model and temporary variables used in said simulation.

22. The simulation method according to claim 15, wherein said producing of said first table includes:

decomposing a total function of said algorithm description model into functions;

scheduling said functions based on clocks in units of groups of allowable status transitions of variables related to said algorithm description model;

allocating resources to each of said scheduled functions under constraint condition of said resources; and said producing of said clock simulation model includes:

assembling said functions to produce said clock level simulation model.

23. The simulation method according to claim 15, wherein said producing of said clock simulation model includes:

producing a FSM/datapath model based on said algorithm description model and said model interface data; and producing said clock level simulation model from said FSM/datapath model, said model interface data, and said first table.

24. A recording medium in which a program for a simulation method is stored, wherein said simulation method comprises:

producing a first table from an algorithm description model comprising variables and operations performed on said variables and model interface data indicative of input and output of variables related to said algorithm description model;

producing a clock level simulation model from said first table and said model interface data, said clock level simulation model being used for simulating operations of resources in units of groups of allowable status transitions of said variables related to said algorithm description model under constraint condition of said resources, and said first table indicating correspondence relationship between said variables related to said algorithm description model and said resources in units of status positions; and carrying out said simulation of said algorithm description model to output variable values in each of said status positions.

25. The recording medium according to claim 24, wherein said simulation method further comprises:

referring to said first table based on said each status position and said variable values to control a display unit to display resource values for said resources in units of said status positions.

26. The recording medium according to claim 24, wherein said simulation method further comprises:

producing a second table from said algorithm description model and said model interface data, said second table indicating correspondence relationship between each of source lines of said algorithm model and a status position; and referring to said second table based on said each status position to control a display unit to display said source line for each of said status positions.

27. The recording medium according to claim 24, wherein said simulation method further comprises:

producing a hardware level simulation model from said algorithm description model and said model interface data, said hardware level simulation model being used for simulating said operations of said resources in units of said resources;

carrying out said simulation of said algorithm description model; and carrying out said simulation of said hardware level simulation model.

28. The recording medium according to claim 27, wherein said simulation method further comprises:

carrying out said simulation while switching between said first to third simulators in response to a switching request.

29. The recording medium according to claim 27, wherein a simulation time of said clock level simulation model is shorter than that of said hardware level simulation model and longer than that of said algorithm description model.

30. The recording medium according to claim 24, wherein said variables related to said algorithm description model include variables included in said algorithm description model and temporary variables used in said simulation.

31. The recording medium according to claim 24, wherein said producing of said first table includes:

decomposing a total function of said algorithm description model into functions;

scheduling said functions based on clocks in units of groups of allowable status transitions of variables related to said algorithm description model;

allocating resources to each of said scheduled functions under constraint condition of said resources; and said producing of said clock simulation model includes:

assembling said functions to produce said clock level simulation model.

32. The recording medium according to claim 24, wherein said producing of said clock simulation model includes:

producing a FSM/datapath model based on said algorithm description model and said model interface data; and producing said clock level simulation model from said FSM/datapath model, said model interface data, and said first table.

* * * * *